United States Patent [19]

Powell

[11] Patent Number: 4,787,510

[45] Date of Patent: Nov. 29, 1988

[54] CARRIER STRIP FOR ELECTRICAL COMPONENTS

[75] Inventor: Francis R. Powell, Cheshire, Conn.

[73] Assignee: AMP Incorporated, Harrisburg, Pa.

[21] Appl. No.: 162,928

[22] Filed: Mar. 2, 1988

[51] Int. Cl.⁴ .............................................. B65D 73/02
[52] U.S. Cl. ................................................... 206/329
[58] Field of Search ................................ 206/329, 328

[56] References Cited

U.S. PATENT DOCUMENTS

| | | | |
|---|---|---|---|
| Re. 32,540 | 11/1987 | Murphy | 206/329 |
| 3,545,606 | 12/1970 | Bennett | 206/329 |
| 4,072,376 | 2/1978 | Shannon | . |
| 4,099,615 | 7/1978 | Lemke et al. | 206/329 |
| 4,422,708 | 12/1983 | Birnholz | 206/329 X |
| 4,442,938 | 4/1984 | Murphy | 206/329 |
| 4,586,607 | 5/1986 | Dubbs et al. | 206/329 |
| 4,615,927 | 10/1986 | Holzmann | 206/329 X |

OTHER PUBLICATIONS

AMP "Miniature Spring Sockets" Catalog 84-763, Rev. 1/86 pp. 1,6,8,9.

*Primary Examiner*—William Price
*Attorney, Agent, or Firm*—Allan B. Osborne

[57] ABSTRACT

A carrier strip for carrying electrical components which are inserted into holes in circuit boards. More particularly, the carrier strip includes a web from which serially arranged, open ended cups extend. The free ends of the cups are adapted to engage the circuit board to cause the separation of the electrical components from the cups during the insertion thereof into the holes in the circuit board.

4 Claims, 2 Drawing Sheets

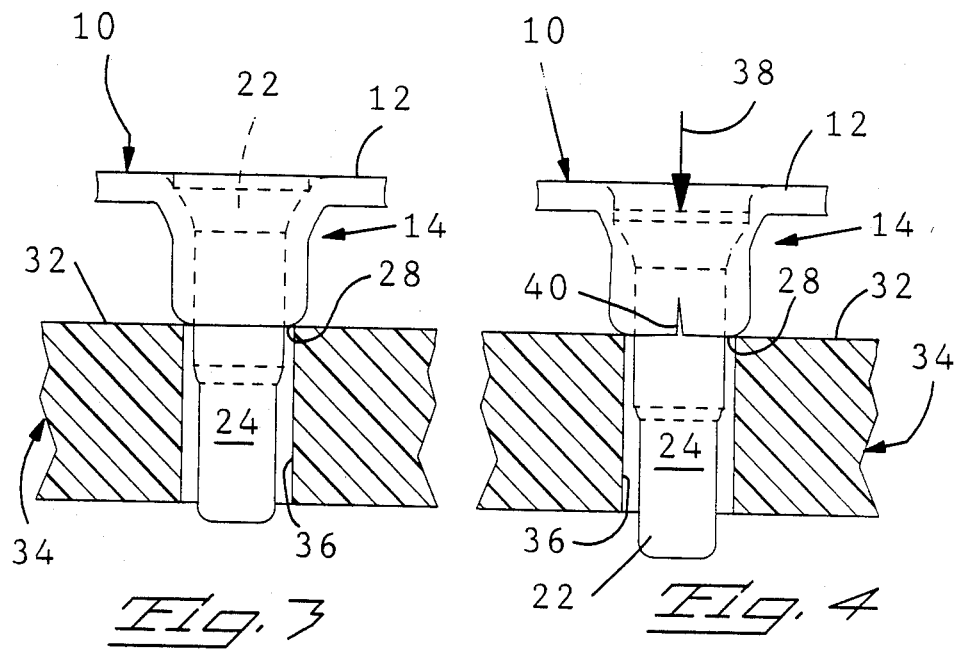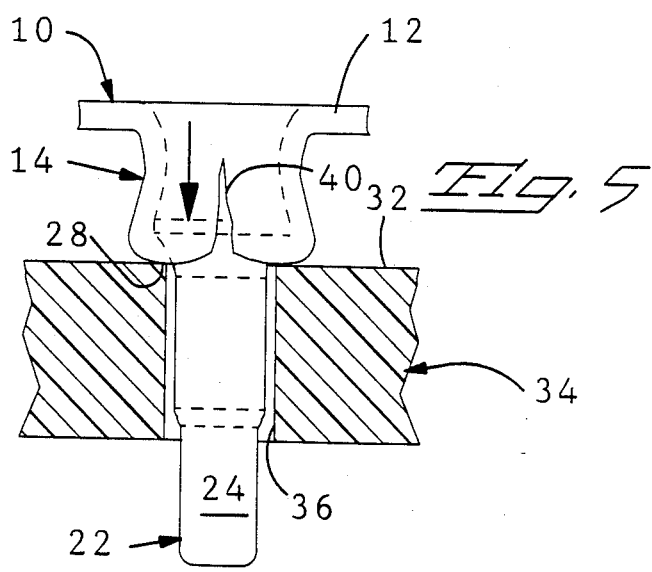

CARRIER STRIP FOR ELECTRICAL COMPONENTS

FIELD OF THE INVENTION

The invention disclosed herein relates to carrier strips on which electrical components are mounted for storage, shipping and for being inserted into holes in printed circuit boards.

BACKGROUND OF THE INVENTION

U.S. Pat. No. 4,099,615 discloses a carrier strip on which electrical components are mounted for storage, shipping and assembly to a printed circuit board via an insertion machine. The carrier strip includes a first web of flexible material having serially arranged apertures in which the components are inserted and seated by an enlarged annular lip engaging the surface of the web. A second web of flexible material is secured to the first web over the components to form an envelope covering at least a portion thereof. The remaining portion of the component projects outwardly from the envelope for insertion into a circuit board. After soldering the components in the board, the carrier strip is removed by being pulled off. In another embodiment, each component is removed from the strip but with a portion of the envelope still surrounding the component so that only the component and portion of the envelope is inserted into the board.

It is now proposed to provide a carrier strip which is released from the component as a part of and during the insertion thereof into the circuit board.

SUMMARY OF THE INVENTION

According to the invention, a carrier strip is provided having a web and a plurality of serially arranged, open ended cups integral with and extending outwardly from the web for receiving electrical components. The wall at the free ends of the cups have a thickness greater than the diameter of the circuit board holes into which the components are inserted so that at least a portion of the wall abuts the surface of the board surrounding the holes to prevent the cup from entering the hole as the component is inserted therein, whereupon the cup and component are separated.

BRIEF DESCRIPTION OF THE DRAWINGS

FIGS. 3, 4 and 5 are cross-sectional views illustrating the separation between the carrier strip and electrical component as the component is being inserted into a circuit board.

DESCRIPTION OF THE INVENTION

Figure 1:
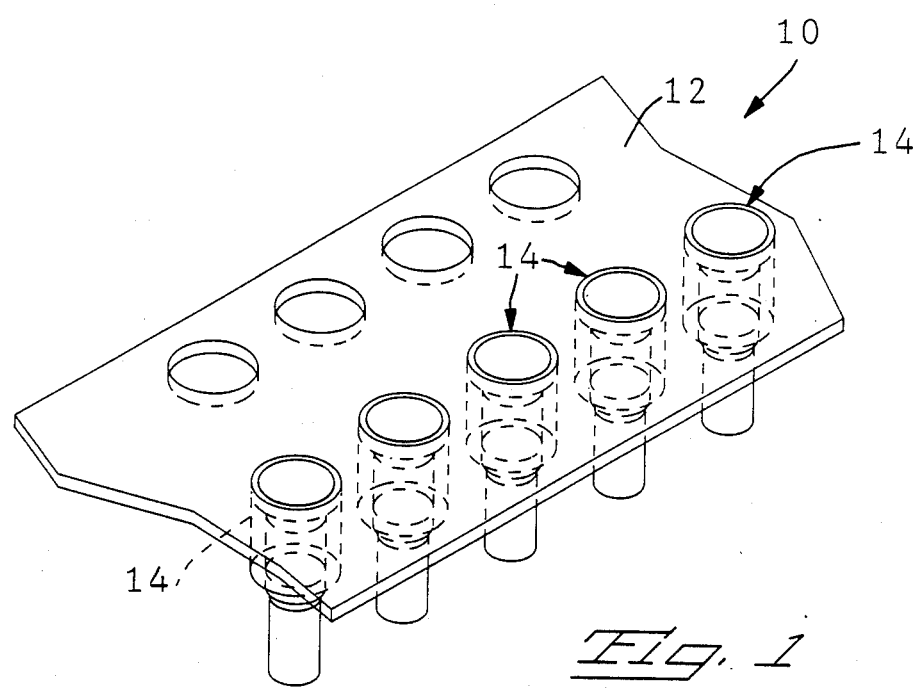
FIG. 1 is a perspective view of a carrier strip constructed in accordance with the present invention.
Figure 2:
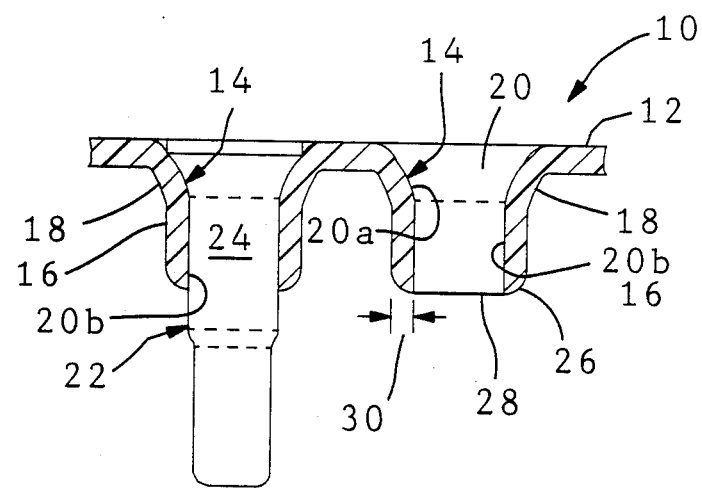
FIG. 2 is a cross-sectional view of the carrier strip with an electrical component mounted therein.

Carrier strip 10 as shown in the Figures, is preferably made from a thermo plastic material such as filled polystyrene or polycarbonate. Strip 10 includes web 12 and a plurality of open ended, serially arranged cups 14, integral with and extending outwardly from web 12. Cups 14 include a lower section 16 and tapered section 18 which is between and joins web 12 and section 16. Passage 20 extends through cup 14 with passage 20a extending through tapered section 18 and passage 20b extending through lower section 16.

As can be appreciated by those skilled in the art, the dimensions of passages 20a, 20b and length of sections 16,18 are correlated to the dimensions of the electrical component to be mounted in cup 14; e.g., component 22 shown in the Figures. For example, the retention of component 22 is preferably by a frictional fit of lower section 16 about body 24 of the component. Accordingly, the diameter of passage 20b would be slightly less than the diameter of body 24.

In addition to the aforementioned dimensions, the thickness of wall 26 at free end 28 of lower section 16 is critical to the proper functioning of carrier strip 10. That thickness, indicated by reference numeral 30 must be great enough so that at least a substantial portion thereof will engage surface 32 of circuit board 34 immediately surrounding component-receiving hole 36 as shown in FIG. 3.

FIGS. 3, 4 and 5 are views showing the insertion of electrical component 22 into circuit board hole 36 and the separation of component 22 from carrier strip 10.

In the drawing of FIG. 3, body 24 of component 22 has been inserted into hole 36 and free end 28 of cup 14 has engaged surface 32 of board 34.

As component 22 is pushed further into hole 36 as shown in FIG. 4 and as indicated by arrow 38, cup 14, unable to move because of free end 28 abutting surface 32, and component 22 separate by the latter sliding out from the former. However, cup 14 does begin to become compressed under the insertion force and, provided one of the two named plastics material (or others with like properties) is used in making strip 10, may begin to crack as indicated by reference numeral 40. With reference to FIG. 5, it can be seen that continued downward pressure on component 22 and cup 14 further the separation of the two and also furthers the cracking of the latter. In either instance, with or without the cracking of cup 14, the engagement of free end 28 against surface 22 of board 34 results in the simultaneous separation of component 22 from strip 10 so that after insertion of component 22, strip 10 is discarded before soldering. The advantage of this of course is that strip 10 does not interfere with either the soldering nor the washing afterwards. With the cracking of cup 14, the separation is very much facilitated and is preferred.

As can be discerned, a carrier strip has been disclosed for use with electrical components. The carrier strip includes open-ended cups which receive and removably retain the components. As the components are being inserted into holes in the printed circuit board, the free ends of the cups engage the surface of the board and prevent downward movement of the cups. As the components are further inserted, the cups tend to compress and may crack to facilitate the separation of the component from the strip.

I claim:

1. A carrier strip for carrying electrical components which are inserted into holes in circuit boards, said carrier strip comprising:
    an elongated web of a suitable plastics material; and
    a plurality of serially arranged, open ended cups integral with and extending outwardly from said web for removably receiving the electrical components, said cups having a free end with a thickness such that upon inserting the electrical components into the holes in the circuit board, at least a portion of said free end engages the circuit board to prevent the cups form entering the hole and to thereby result in the separation of the electrical components from said cups.

2. The carrier strip of claim 1 wherein said cups tend to crack as said free ends engage the board to facilitate the separation of the electrical components from said cups.

3. The carrier strip of claim 2 wherein the plastics material is filled polystyrene.

4. The carrier strip of claim 3 wherein the plastics material is polycarbonate.

* * * * *